(12) United States Patent
Xu

(10) Patent No.: US 11,315,952 B2
(45) Date of Patent: Apr. 26, 2022

(54) ARRAY SUBSTRATE, MANUFACTURING METHOD THEREOF, AND DISPLAY PANEL

(71) Applicant: Wuhan China Star Optoelectronics Semiconductor Display Technology Co., LTD., Hubei (CN)

(72) Inventor: Zuzhao Xu, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 280 days.

(21) Appl. No.: 16/625,880

(22) PCT Filed: Sep. 23, 2019

(86) PCT No.: PCT/CN2019/107215
§ 371 (c)(1),
(2) Date: Dec. 23, 2019

(87) PCT Pub. No.: WO2021/027024
PCT Pub. Date: Feb. 18, 2021

(65) Prior Publication Data
US 2021/0408067 A1    Dec. 30, 2021

(30) Foreign Application Priority Data
Aug. 9, 2019   (CN) .......................... 201910733593.5

(51) Int. Cl.
*H01L 27/12*    (2006.01)

(52) U.S. Cl.
CPC ...... *H01L 27/1222* (2013.01); *H01L 27/1237* (2013.01); *H01L 27/1248* (2013.01); *H01L 27/1262* (2013.01)

(58) Field of Classification Search
CPC ..... H01L 27/12; H01L 27/122; H01L 27/123; H01L 27/124; H01L 27/126;
(Continued)

(56) References Cited

U.S. PATENT DOCUMENTS

2015/0303099 A1* 10/2015 Lee .................. H01L 21/32139
                                                              438/701
2016/0254287 A1*  9/2016 Wang ................. H01L 29/4908
                                                              257/40

FOREIGN PATENT DOCUMENTS

| CN | 107424957 A | 12/2017 |
|----|-------------|---------|
| CN | 108598089 A | 9/2018  |
| CN | 109962078 A | 7/2019  |

* cited by examiner

*Primary Examiner* — Fazli Erdem
(74) *Attorney, Agent, or Firm* — Benesch, Friedlander, Coplan & Aronoff LLP

(57) ABSTRACT

The present disclosure relates to an array substrate, a manufacturing method thereof, and a display panel, the array substrate including: a substrate, and a low temperature polysilicon layer, an inorganic film group layer, and a source/drain layer disposed on the substrate in sequence. The substrate includes a display region, the low temperature polysilicon layer located at the display region, the inorganic film group layer provided with a through hole, and an angle between a sidewall and a bottom wall of the through hole is not less than 100 degrees; the source/drain layer covering the sidewall and the bottom wall of the through hole to be connected to the low temperature polysilicon layer.

11 Claims, 4 Drawing Sheets

(58) Field of Classification Search
CPC ............. H01L 27/1222; H01L 27/1237; H01L 27/1248; H01L 27/1262
USPC ........................................................ 257/59
See application file for complete search history.

S431 depositing a first gate insulating layer on the substrate on which the low temperature polysilicon layer is formed, the first gate insulating layer covering the low temperature polysilicon layer

S432 depositing a second gate insulating layer on the first gate insulating layer

S433 depositing an interlayer dielectric layer on the second gate insulating layer, wherein a total thickness of the first gate insulating layer, the second gate insulating layer, and the interlayer dielectric layer is less than 740 nm

FIG. 6

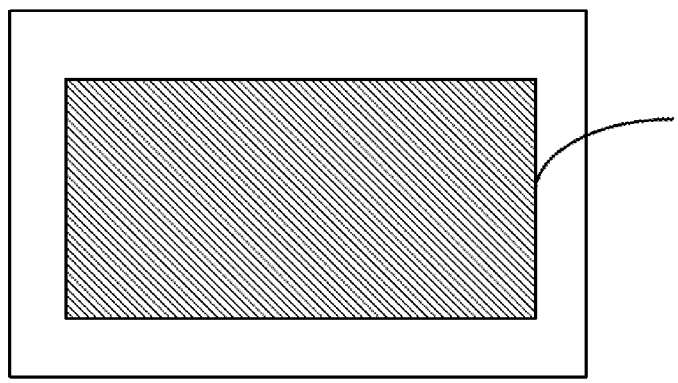

FIG. 7

ARRAY SUBSTRATE, MANUFACTURING METHOD THEREOF, AND DISPLAY PANEL

FIELD OF INVENTION

The present disclosure relates to the field of display technology, in particular, to an array substrate, a manufacturing method thereof, and a display panel.

BACKGROUND OF INVENTION

Active-matrix organic light emitting diode (AMOLED) panel has gradually become new generation of display technology due to its high contrast, wide color gamut, low power consumption, and foldability.

Currently, in the array substrate manufacturing process of the AMOLED panel, source layer and drain layer are connected to the active layer of the thin film transistor through the interlayer hole. However, since the taper angle of the interlayer hole is too large, the source layer and drain layer may be thin or even broken.

SUMMARY OF INVENTION

The object of the present disclosure is to provide an array substrate, a manufacturing method thereof, and a display panel to prevent the source/drain layer from being thin or even broken due to an excessively large taper angle of the interlayer hole.

To solve the above problems, the present disclosure provides: an array substrate, including: a substrate including a display region; a low temperature polysilicon layer disposed on the substrate and located at the display region; an inorganic film group layer disposed on the substrate and covering the low temperature polysilicon layer, wherein the inorganic film group layer is provided with a through hole, the through hole is located above the low temperature polysilicon layer, and an angle between a sidewall and a bottom wall of the through hole is not less than 100 degrees; and a source/drain layer disposed on the inorganic film group layer, the source/drain layer covering the sidewall and the bottom wall of the through hole to be connected to the low temperature polysilicon layer.

The angle between the sidewall and the bottom wall of the through hole ranges from 105 to 110 degrees.

The inorganic film group layer includes a first gate insulating layer, a second gate insulating layer, and an interlayer dielectric layer which are sequentially away from the low temperature polysilicon layer, a total thickness of the first gate insulating layer, the second gate insulating layer, and the interlayer dielectric layer is less than 740 nm.

A thickness of the first gate insulating layer is less than 130 nm.

A thickness of the second gate insulating layer is less than 110 nm.

A thickness of the interlayer dielectric layer is less than 500 nm.

The array substrate further includes a first metal layer and a second metal layer sequentially away from the low temperature polysilicon layer, the first metal layer and the second metal layer are both located at the display region, and the first metal layer is located between the first gate insulating layer and the second gate insulating layer, the second metal layer is located between the second gate insulating layer and the interlayer dielectric layer, and a projection region of the through hole on the substrate does not overlap with a projection region of the first metal layer and the second metal layer on the substrate.

The array substrate further includes an organic layer, the organic layer is located on the inorganic film group layer and does not fill the through hole, the source/drain layer located on the organic layer, and a thickness of the organic layer being less than 1500 nm.

To solve the above problems, the present disclosure further provides: A method of manufacturing an array substrate, including: providing a substrate including a display region; forming a low temperature polysilicon layer on the substrate and located at the display region; forming an inorganic film group layer on the substrate on which the low temperature polysilicon layer is formed; forming a through hole on the inorganic film group layer, wherein the through hole is located above the low temperature polysilicon layer, and an angle between a sidewall and a bottom wall of the through hole is not less than 100 degrees; and forming a source/drain layer on the inorganic film group layer, the source/drain layer covering the sidewall and the bottom wall of the through hole to be connected to the low temperature polysilicon layer.

The inorganic film group layer includes a first gate insulating layer, a second gate insulating layer, and an interlayer dielectric layer which are sequentially away from the low temperature polysilicon layer, the step of forming the inorganic film group layer on the substrate on which the low temperature polysilicon layer is formed includes: depositing a first gate insulating layer on the substrate on which the low temperature polysilicon layer is formed, the first gate insulating layer covering the low temperature polysilicon layer; depositing a second gate insulating layer on the first gate insulating layer; depositing an interlayer dielectric layer on the second gate insulating layer, and wherein a total thickness of the first gate insulating layer, the second gate insulating layer, and the interlayer dielectric layer is less than 1500 nm.

The step of forming the through hole on the inorganic film group layer further includes: forming an organic layer on the inorganic film group layer, wherein the organic layer does not fill the through hole, and a thickness of the organic layer is less than 1500 nm.

To solve the above problems, the present disclosure further provides: A display panel, including an array substrate, the array substrate including: a substrate including a display region; a low temperature polysilicon layer disposed on the substrate and located at the display region; an inorganic film group layer disposed on the substrate and covering the low temperature polysilicon layer, wherein the inorganic film group layer is provided with a through hole, the through hole is located above the low temperature polysilicon layer, and an angle between a sidewall and a bottom wall of the through hole is not less than 100 degrees; and a source/drain layer disposed on the inorganic film group layer, the source/drain layer covering the sidewall and the bottom wall of the through hole to be connected to the low temperature polysilicon layer.

The angle between the sidewall and the bottom wall of the through hole ranges from 105 to 110 degrees.

The inorganic film group layer includes a first gate insulating layer, a second gate insulating layer, and an interlayer dielectric layer which are sequentially away from the low temperature polysilicon layer, a total thickness of the first gate insulating layer, the second gate insulating layer, and the interlayer dielectric layer is less than 740 nm.

A thickness of the first gate insulating layer is less than 130 nm.

A thickness of the second gate insulating layer is less than 110 nm.

A thickness of the interlayer dielectric layer is less than 500 nm.

The array substrate further includes a first metal layer and a second metal layer sequentially away from the low temperature polysilicon layer, the first metal layer and the second metal layer are both located at the display region, and the first metal layer is located between the first gate insulating layer and the second gate insulating layer, the second metal layer is located between the second gate insulating layer and the interlayer dielectric layer, and a projection region of the through hole on the substrate does not overlap with a projection region of the first metal layer and the second metal layer on the substrate.

The array substrate further includes an organic layer, the organic layer is located on the inorganic film group layer and does not fill the through hole, the source/drain layer located on the organic layer, and a thickness of the organic layer being less than 1500 nm.

The beneficial effect of the present disclosure is: The array substrate provided by the present application includes a substrate, a low temperature polysilicon layer, an inorganic film group layer, and a source/drain layer disposed on the substrate in sequence, wherein the substrate includes a display region, the low temperature polysilicon layer is located at the display region, and the inorganic film group layer is provided with a through hole, the through hole is located above the low temperature polysilicon layer, and an angle between a sidewall and a bottom wall of the through hole is not less than 100 degrees, and the source layer and drain layer covering the sidewall and the bottom wall of the through hole to be connected to the low temperature polysilicon layer. Thus, by reducing the taper angle of the through hole between the source/drain layer and the low temperature polysilicon layer, thereby solving the problem that source layer and drain layers being thin or even broken at the taper angle position of the through hole, improving the product yield.

DESCRIPTION OF DRAWINGS

In order to more clearly illustrate the technical solutions in the embodiments of the present disclosure, the figures used in the description of the embodiments will be briefly described below. It is obvious that the figures in the following description are only some embodiments of the present disclosure. Other figures can also be obtained from those skilled in the art based on these drawings without any inventive steps.

FIG. 6 is a schematic diagram of S43 in FIG. 1.

FIG. 7 is a schematic diagram of a display panel provided by an embodiment of the present disclosure.

DETAILED DESCRIPTION OF PREFERRED EMBODIMENTS

The present disclosure will be further described in detail below with reference to the accompanying figures and embodiments. It is specifically noted that the following embodiments are merely illustrative of the present disclosure, but are not intended to limit the scope of the present disclosure. In the same manner, the following embodiments are only partial embodiments of the present disclosure, and not all of the embodiments, and all other embodiments obtained by those skilled in the art without inventive steps are within the scope of the present disclosure.

Currently, in an array substrate manufacturing process of AMOLED panel, a source/drain layer is connected to an active layer of a thin film transistor through an interlayer hole. However, since a taper angle of the interlayer hole is too large, the source layer and drain layer may be thin or even broken. In order to solve the above technical problems, the technical solution adopted in the present disclosure is to provide an array substrate to prevent the source/drain layer from being thin or even broken due to an excessively large taper angle of the interlayer hole.

Figure 1:
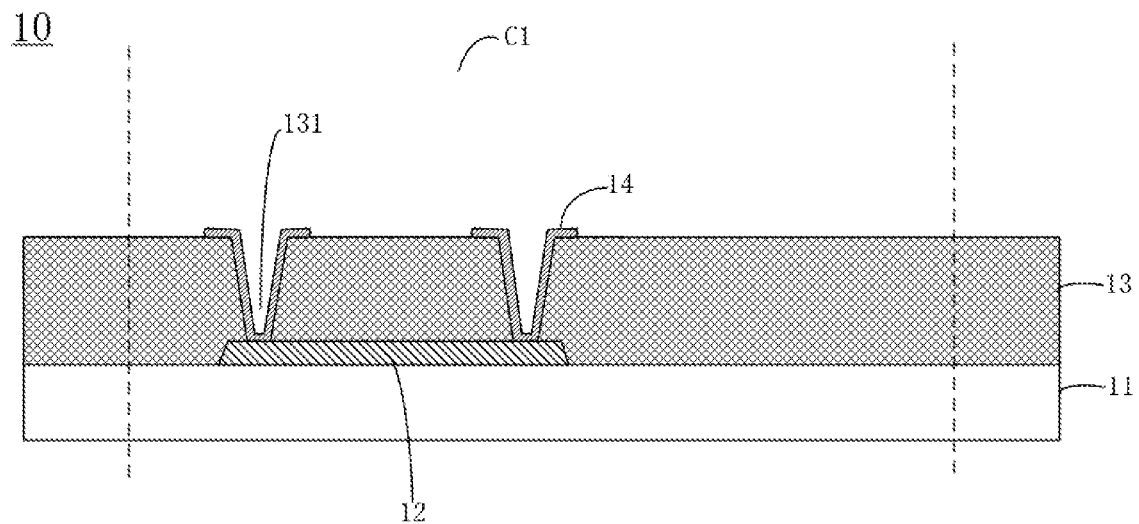
FIG. 1 is a schematic diagram of an array substrate provided by an embodiment of the present disclosure.
Figure 2:
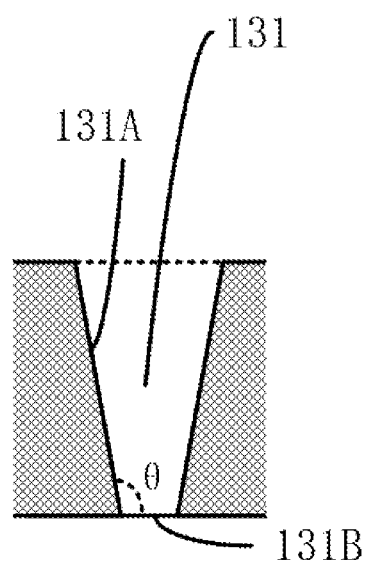
FIG. 2 is a schematic diagram of a through hole 131 in FIG. 1.

Please refer to FIG. 1 and FIG. 2, FIG. 1 is a schematic diagram of an array substrate provided by an embodiment of the present disclosure, FIG. 2 is a schematic diagram of a through hole 131 in FIG. 1. As shown in FIG. 1 and FIG. 2, the array substrate 10 includes a substrate 11, and a low temperature polysilicon layer 12, an inorganic film group layer 13, and a source/drain layer 14 which are sequentially disposed on the substrate 11, wherein the substrate 11 includes a display region C1. The low temperature polysilicon layer 12 is located at the display region C1, the inorganic film group layer 13 covers the low temperature polysilicon layer 12, and the through hole 131 is disposed on the low temperature polysilicon layer 12, wherein the through hole 131 is located on the low temperature polysilicon layer 12, and an angle between a sidewall 131A and a bottom wall 131B of the through hole 131 is not less than 100 degrees, and the source/drain layer 14 covers the sidewall 131A and the bottom wall 131B of the through hole 131 and is connected to the low temperature polysilicon layer 12.

In this embodiment, the angle θ is disposed between the sidewall 131A and the bottom wall 131B of the through hole 131 and is not less than 100 degrees; that is, the taper angle of the through hole 131 is not more than 80 degrees, thereby preventing a thickness of the source/drain layer 14 disposed on the sidewall 131A and the bottom wall 131B of the through hole 131 from being thin or even broken at the taper angle position due to an excessively large taper angle.

In this embodiment, an etching condition such as a series of different exposure times, exposure energy, and etching liquid can be designed to ensure that the angle θ between the sidewall 131A and the bottom wall 131B of the through hole 131 is not less than 100 degrees. For example, in some embodiments, the angle between the sidewall 131A and the bottom wall 131B of the through hole 131 may range between 105 to 110 degrees, that is, the taper angle of the through hole 131 may range between 70 to 75 degrees, in a bid to prevent the problem that the source/drain layer 14 is thin or even broken at the taper angle position of the through hole 131.

The substrate 11 may be a flexible substrate and may be made of one of organic polymers such as a polyimide, a polycarbonate, a polyethylene terephthalate, or a polyethersulfone. A material of the source/drain layer 14 may be a metal material such as aluminum, copper, or silver.

Figure 3:
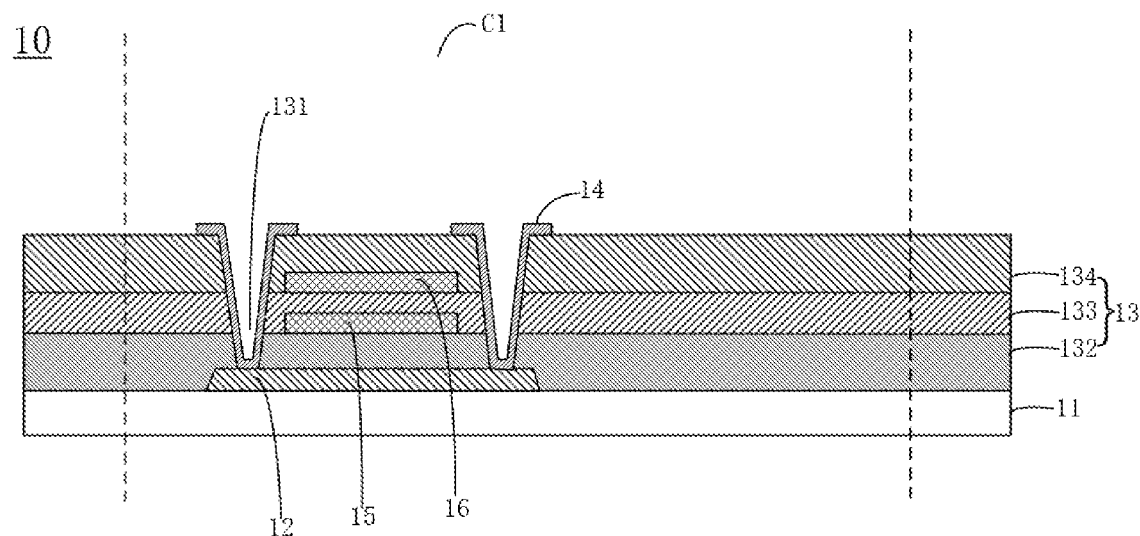
FIG. 3 is another schematic diagram of an array substrate provided by an embodiment of the present disclosure.

Specifically, as shown in FIG. 3, the inorganic film group layer 13 may include a first gate insulating layer 132, a second gate insulating layer 133, and an interlayer dielectric layer 134 which are sequentially away from the low temperature polysilicon layer 12, and the through holes 131 are located above the low temperature polysilicon layer 12, and penetrate through the first gate insulating layer 132, the second gate insulating layer 133, and the interlayer dielectric layer 134.

A material of the first gate insulating layer 132 may be SiOx, a material of the second gate insulating layer 133 may be silicon nitride, and a material of the interlayer dielectric layer 134 may be one or two of silicon nitride and SiOx.

In some embodiments, a total thickness of the first gate insulating layer 132, the second gate insulating layer 133, and the interlayer dielectric layer 134 may be reduced to reduce a depth of the through holes 131 penetrating through the first gate insulating layer 132, the second gate insulating layer 133, and the interlayer dielectric layer 134, thereby reducing the bending stress of the source/drain layer 14 on inner walls of the through holes 131, to prevent the problem of a broken line occurring on the source/drain layer 14. For example, in current array substrate, if the total thickness of the first gate insulating layer 132, the second gate insulating layer 133, and the interlayer dielectric layer 134 is 740 nm, then in this embodiment, the total thickness of the first gate insulating layer 132, the second gate insulating layer 133, and the interlayer dielectric layer 134 may be less than 740 nm, to prevent the problem that the source/drain layer 14 is broken due to excessive bending stress caused by excessive depth of the through hole 131.

In a specific embodiment, the objective of reducing the total thickness of the first gate insulating layer 132, the second gate insulating layer 133, and the interlayer dielectric layer 134 may be achieved by reducing a thickness of the first gate insulating layer 132. For example, in the current array substrate, if the thickness of the first gate insulating layer 132 is 130 nm, then in this embodiment, the thickness of the first gate insulating layer 132 may be less than 130 nm. Moreover, in a specific implementation, a series of different thicknesses of the first gate insulating layer 132, such as 120 nm, 110 nm, 100 nm, and 90 nm, may be designed for testing, to determine optimum thickness of the first gate insulating layer 132 without affecting optoelectronics performance of the array substrate.

In another specific embodiment, the objective of reducing the total thickness of the first gate insulating layer 132, the second gate insulating layer 133, and the interlayer dielectric layer 134 can be achieved by reducing a thickness of the second gate insulating layer 133. For example, in the current array substrate, if the thickness of the second gate insulating layer 133 is 110 nm, then in this embodiment, the thickness of the second gate insulating layer 133 may be less than 110 nm. Moreover, in a specific implementation, a series of different thicknesses of the second gate insulating layer 133, such as 100 nm, 90 nm, 80 nm, and 70 nm, may be designed for testing, to determine optimum thickness of the second gate insulating layer 133 without affecting the optoelectronics performance of the array substrate.

In yet another specific embodiment, the objective of reducing the total thickness of the first gate insulating layer 132, the second gate insulating layer 133, and the interlayer dielectric layer 134 can be achieved by reducing a thickness of interlayer dielectric layer 134. For example, in the current array substrate, if the thickness of the interlayer dielectric layer 134 is 500 nm, then in this embodiment, the thickness of the interlayer dielectric layer 134 may be less than 500 nm. Moreover, in a specific implementation, a series of different thicknesses of the interlayer dielectric layer 134, such as 490 nm, 480 nm, 470 nm, and 460 nm, may be designed for testing, to determine optimum thickness of the interlayer dielectric layer 134 without affecting the optoelectronics performance of the array substrate.

It should be noted that, in order to reduce the total thickness of the first gate insulating layer 132, the second gate insulating layer 133, and the interlayer dielectric layer 134, the thicknesses of the first gate insulating layer 132, the second gate insulating layer 133, and the interlayer dielectric layer 134 may be simultaneously reduced. For example, the thickness of the first gate insulating layer 132 is less than 130 nm, the thickness of the second gate insulating layer 133 is less than 110 nm, and the thickness of the interlayer dielectric layer 134 is less than 500 nm. It is also possible to reduce only the thickness of one or two of the first gate insulating layer 132, the second gate insulating layer 133, and the interlayer dielectric layer 134.

Please refer to FIG. 3, the array substrate 10 further includes a first metal layer 15 and a second metal layer 16 sequentially away from the low temperature polysilicon layer 12. Wherein, the first metal layer 15 and the second metal layer 16 are both located at the display region C1, the first metal layer 15 is located between the first gate insulating layer 132 and the second gate insulating layer 133, and the second metal layer 16 is located between the second gate insulating layer 133 and the interlayer dielectric layer 134.

Specifically, the low temperature polysilicon layer 12 may be an active layer of a thin film transistor in the array substrate 10, and the source/drain layers 14 are connected to the low temperature polysilicon layer 12 via the through holes 131. The first metal layer 15 may be a patterned gate layer, and includes a gate of the thin film transistor in the array substrate 10 and a lower electrode of the storage capacitor. The second metal layer 16 may include an upper electrode of a storage capacitor in the array substrate 10, and the upper electrode and the lower electrode of the first metal layer 15 together constitute a storage capacitor in the array substrate 10.

In this embodiment, a projection region of the through hole 131 on the substrate 11 does not overlap with a projection region of the first metal layer 15 and the second metal layer 16 on the substrate 11. That is, when the through hole 131 is formed in the inorganic film group layer 13, the first metal layer 15 and the second metal layer 16 are not damaged.

Figure 4:
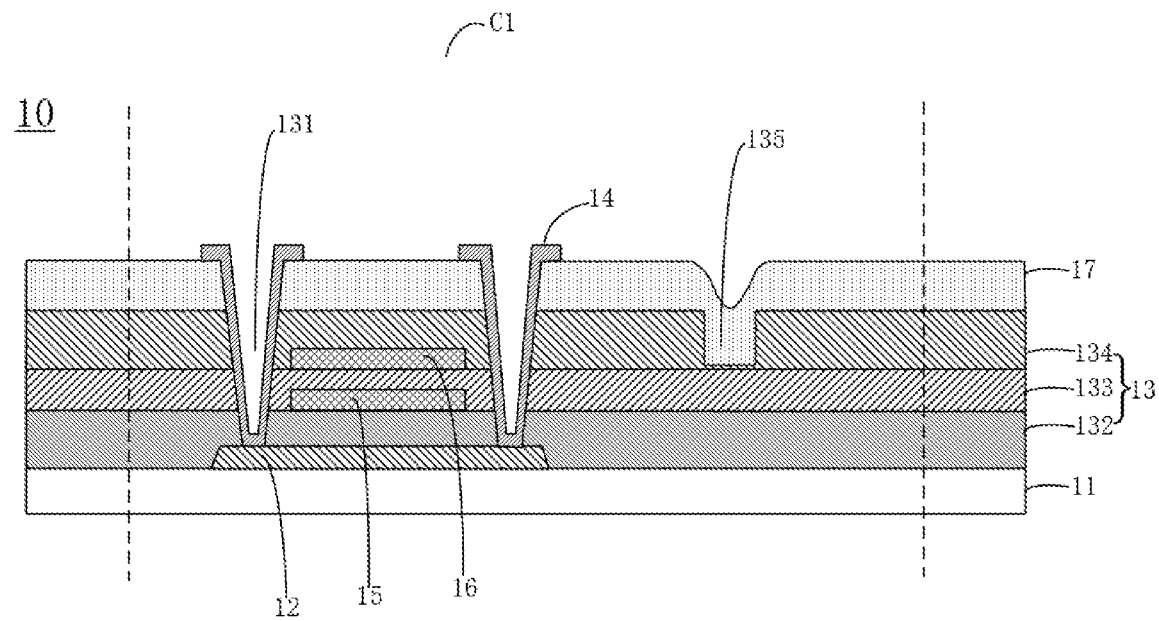
FIG. 4 is yet another schematic diagram of an array substrate provided by an embodiment of the present disclosure.

In some embodiments, as shown in FIG. 4, the inorganic film group layer 13 may further include an opening 135, the opening 135 is located in the display region C1, and a projection region of the opening 135 on the substrate 11 does not overlap the projection regions of the low temperature polysilicon layer 12, the first metal layer 15, and the second metal layer 16. That is, the opening 135 is formed on the inorganic film group layer 13 without damaging the structure of the thin film transistor in the array substrate 10.

Furthermore, the array substrate 10 may further include an organic layer 17, the organic layer 17 is located on the inorganic film group layer 13 and does not fill the opening 135, and the source/drain layer 14 is located on the organic layer 17. By forming the opening 135 on the inorganic film group layer 13, forming the organic layer 17 on the inorganic film group layer 13, and filling the opening 135 with the organic layer 17, the bending stress on the display region C1 can be reduced, thereby improving the bending performance of the area C1.

Specifically, the organic layer 17 located between the inorganic film group layer 13 and the source/drain layer 14 increases the film layer difference in a vicinity of the through hole 131, thereby exacerbating the problem that the local thickness of the source/drain layer 14 covering the inner wall of the through hole 131 is thin or even broken. In order to solve this technical problem, a thickness of the organic layer 17 described above can be reduced, for example, the thickness of the organic layer 17 can be set to be less than 1500 nm.

A material of the organic layer 17 may be an organic insulating material such as a polyimide resin, an epoxy resin, or an acrylic resin.

It should be noted that the organic layer 17 is a layer structure having a uniform thickness as a whole. However, since the inorganic film group layer 13 has a height difference at the opening 135, this results in the problem that the organic layer 17 will have a certain degree of thickness non-uniformity at the opening 135 after filling the opening 135. Therefore, in the present disclosure, the thickness of the organic layer 17 is based on the thickness of the organic layer 17 which away from the opening 135.

Different from the prior art, the array substrate in this embodiment reduces a taper angle of the through hole between the source/drain layer and the low temperature polysilicon layer to prevent the source/drain layer from being thin or even broken at the taper angle position of the through hole, thereby improving the product yield.

Figure 5:
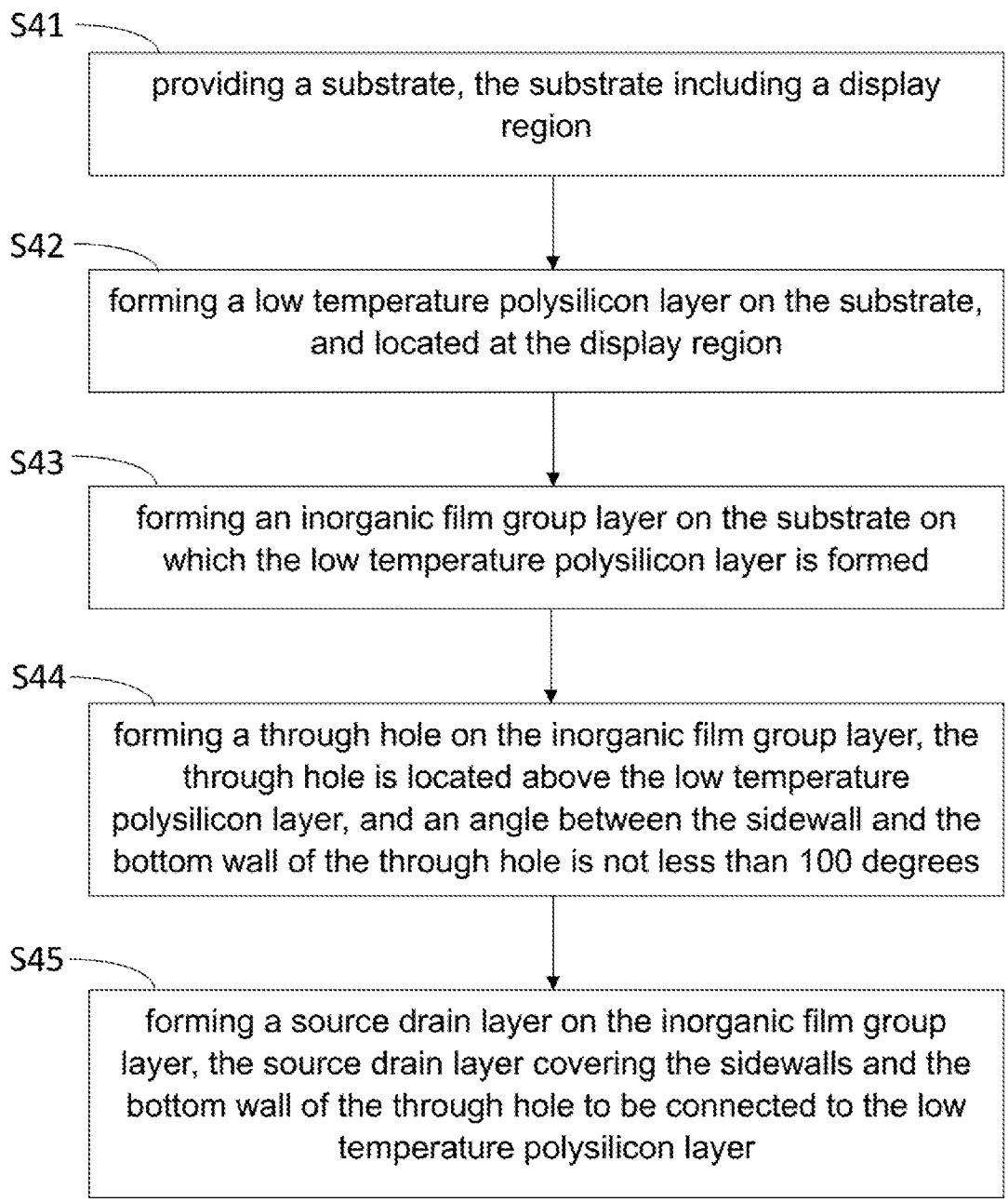
FIG. 5 is a flowchart of a method of manufacturing an array substrate provided by an embodiment of the present disclosure.

Please refer to FIG. 5, FIG. 5 is a flowchart of a method of manufacturing an array substrate provided by an embodiment of the present disclosure. The specific method of manufacturing the array substrate may be as follows:

S41: providing a substrate, wherein the substrate includes a display region.

The substrate may be a flexible substrate, and a material of the substrate may be one of organic polymers such as a polyimide, a polycarbonate, a polyethylene terephthalate, or a polyethersulfone.

S42: forming a low temperature polysilicon layer on the substrate, located at the display region.

For example, in the display region, an amorphous silicon layer is formed on the substrate by a chemical vapor deposition process, and then the amorphous silicon layer is processed by an excimer laser annealing process to form a corresponding low temperature polysilicon layer.

S43: forming an inorganic film group layer on the substrate on which the low temperature polysilicon layer is formed.

The inorganic film group layer may include a first gate insulating layer, a second gate insulating layer, and an interlayer dielectric layer which are sequentially away from the low temperature polysilicon layer. Specifically, as shown in FIG. 6, S43 may include:

S431: depositing the first gate insulating layer on the substrate on which the low temperature polysilicon layer is formed, the first gate insulating layer covering the low temperature polysilicon layer.

For example, using a chemical vapor deposition process, forming the first gate insulating layer on the substrate on which the low temperature polysilicon layer is formed. A material of the first gate insulating layer may be SiOx.

S432: depositing the second gate insulating layer on the first gate insulating layer.

For example, using a chemical vapor deposition process, depositing the second gate insulating layer on the first gate insulating layer. A material of the second gate insulating layer may be SiNx.

S433: depositing the interlayer dielectric layer on the second gate insulating layer, wherein a total thickness of the first gate insulating layer, the second gate insulating layer, and the interlayer dielectric layer is less than 740 nm.

For example, using a chemical vapor deposition process, forming the interlayer dielectric layer on the second gate insulating layer. A material of the interlayer dielectric layer may be one or two of SiNx and SiOx.

In a specific embodiment, after S431 and before S432, the method may further include:

Sub-step A: forming a first metal layer on the first gate insulating layer, the first metal layer is located at the display region, and the second gate insulating layer covers the first metal layer.

The first metal layer may be a patterned gate layer including a gate of the thin film transistor in the array substrate and a lower electrode of the storage capacitor. Specifically, the sub-step A may specifically include: depositing a first metal material layer on the first gate insulating layer by using a physical vapor deposition process in the display region, and then patterning the first metal material layer by an exposure and etching process to obtain the patterned gate layer. A material of the first metal layer may be molybdenum.

After S432 and before S433, it may also include:

Sub-step B: forming a second metal layer on the second gate insulating layer, the second metal layer is located in the display region, and the interlayer dielectric layer covers the second metal layer.

The second metal layer includes an upper electrode of a storage capacitor in the array substrate, and the upper electrode and the lower electrode of the first metal layer together constitute a storage capacitor in the array substrate. Specifically, the sub-step B may specifically include: laying a second metal material layer on the second gate insulating layer by using a physical vapor deposition process in the display region, and then patterning the second metal material layer by an exposure and etching process to obtain the second metal layer. A material of the second metal layer may be molybdenum.

S44: forming a through hole on the inorganic film group layer, the through hole is located above the low temperature polysilicon layer, and an angle between the sidewall and the bottom wall of the through hole is not less than 100 degrees.

For example, etching a predetermined position of the inorganic film group layer located on the display region to form the through hole. The through hole penetrates through the first gate insulating layer, the second gate insulating layer, and the interlayer dielectric layer. A projection region of the through hole on the substrate does not overlap with a projection region of the first metal layer and the second metal layer on the substrate. That is, when the first opening is formed on the inorganic film group layer, the first metal layer and the second metal layer are not damaged.

Specifically, an etching condition such as a series of different exposure times, exposure energy, and etching liquid can be designed to ensure that the angle θ between the sidewall and the bottom wall of the through hole is not less than 100 degrees. For example, in some embodiments, the angle between the sidewall and the bottom wall of the through hole may range between 105 and 110 degrees S45: forming a source/drain layer on the inorganic film group layer, the source/drain layer covering the sidewalls and the bottom wall of the through hole to be connected to the low temperature polysilicon layer.

For example, laying a source/drain material layer on the inorganic film group layer and the sidewalls and the bottom wall of the through hole by a physical vapor deposition process, and then patterning the source/drain material layer by an exposure and etching process to obtain a patterned source/drain layer. A material of the source/drain layers may be a metal material such as an aluminum, a copper or a silver, and the source/drain layer is connected to the low temperature polysilicon layer by the through hole.

In this embodiment, the angle disposed between the side wall and the bottom wall of the through hole is not less than 100 degrees, that is, the taper angle of the through hole is not more than 80 degrees to prevent a thickness of the source/drain layer disposed on the side wall and the bottom wall of the through hole from being thin or even broken at the taper angle position of the through hole due to an excessively large taper angle.

In the S431, S433, and S433, a total thickness of the first gate insulating layer, the second gate insulating layer, and the interlayer dielectric layer formed by the control is less than 740 nm, to reduce a depth of the through hole penetrating through the first gate insulating layer, the second gate insulating layer, and the interlayer dielectric layer, thereby reducing the bending stress of the source/drain layer on the inner walls of the through holes to prevent the problem of a broken line occurring on the source/drain layer.

Specifically, a thickness of the first gate insulating layer formed by the control may be less than 130 nm, or a thickness of the second gate insulating layer formed by the control may be less than 110 nm, or a thickness of the interlayer dielectric layer formed by the control may be less than 500 nm, to achieve the objective of the total thickness of the first gate insulating layer, the second gate insulating layer, and the interlayer dielectric layer being less than 740 nm.

In one embodiment, the inorganic film group layer may further include an opening located in the display region, and the projection region of the opening on the substrate does not overlap with the projection regions of the low temperature polysilicon layer, the first metal layer, and the second metal layer. That is, the opening is formed on the inorganic film group layer without damaging the structure of the thin film transistor in the array substrate. Specifically, the above S44 may specifically include: forming a through hole and the opening on the inorganic film group layer, the through hole is located above the low temperature polysilicon layer, the opening is located in the display region, and the angle between the sidewall and the bottom wall of the through hole is not less than 100 degrees.

Furthermore, after the S44 and before S45, the method may further include:

Forming an organic layer on the inorganic film group layer, the organic layer fills the opening, but the through hole is not filled; the source/drain layer is on the organic layer, and a thickness of the organic layer is less than 1500 nm.

As described above, by forming the opening on the inorganic film group layer, forming the organic layer on the inorganic film group layer, and the organic layer filling the opening, the bending stress on the display region can be reduced, and the bending performance of the display region can be improved.

In addition, by controlling the thickness of the organic layer formed to be less than 1500 nm, the film layer difference in the vicinity of the through hole can be reduced, thereby preventing the problem that part of the source/drain layer covering the inner wall of the through hole is thin or even broken.

Different from the prior art, the method of manufacturing the array substrate in the embodiment reduces the taper angle of the through hole between the source/drain layer and the low temperature polysilicon layer, preventing the problem that the source/drain layer is thinner or even broken at the taper angle position of the through hole, thereby improving the product yield.

Please refer to FIG. 7. FIG. 7 is a schematic structural diagram of a display panel according to an embodiment of the present disclosure. As shown in FIG. 7, the display panel 80 includes an array substrate 81 of any of the above embodiments.

The array substrate 81 includes a substrate, and a low temperature polysilicon layer, an inorganic film group layer, and a source/drain layer disposed in sequence on the substrate, wherein the substrate includes a display region, the low temperature polysilicon layer is located at the display region, and the inorganic film group layer covers the low temperature polysilicon layer, a through hole is disposed thereon. The through hole is located above the low temperature polysilicon layer, and an angle between the sidewall and the bottom wall of the through hole is not less than 100 degrees. The source/drain layer covering the sidewall and the bottom wall of the through hole is connected to the low temperature polysilicon layer.

Different from the prior art, the display panel in this embodiment reduces the taper angle of the through hole between the source/drain layer and the low temperature polysilicon layer, thereby solving the problem of the source/drain layers being thin or even broken at the taper angle position of the through hole, improving the product yield.

The above is only the preferred embodiment of the present disclosure, and is not intended to limit the present disclosure. Any modifications, equivalent substitutions and improvements made within the spirit and principles of the present disclosure should be included in the scope of the protection of the present disclosure.

What is claimed is:

1. An array substrate, comprising:
a substrate comprising a display region;
a low temperature polysilicon layer disposed on the substrate and located at the display region;
an inorganic film group layer disposed on the substrate and covering the low temperature polysilicon layer, wherein the inorganic film group layer is provided with a through hole, the through hole is located above the low temperature polysilicon layer, and an angle between a sidewall and a bottom wall of the through hole ranges from 105 to 110 degrees, wherein the inorganic film group layer comprises a first gate insulating layer, a second gate insulating layer, and an interlayer dielectric layer, which are sequentially away from the low temperature polysilicon layer; a total thickness of the first gate insulating layer, the second gate insulating layer, and the interlayer dielectric layer is less than 740 nm; and
a first metal layer disposed between the first gate insulating layer and the second gate insulating layer;
a second metal layer disposed between the second gate insulating layer and the interlayer dielectric layer;
an organic layer disposed on the inorganic film group layer and does not fill the through hole, the source/drain layer is located on the organic layer, and a thickness of the organic layer is less than 1500 nm; and
a source/drain layer disposed on the organic layer, the source/drain layer covering the sidewall and the bottom wall of the through hole to be connected to the low temperature polysilicon layer.

2. The array substrate as claimed in claim 1, wherein a thickness of the first gate insulating layer is less than 130 nm.

3. The array substrate as claimed in claim 1, wherein a thickness of the second gate insulating layer is less than 110 nm.

4. The array substrate as claimed in claim 1, wherein a thickness of the interlayer dielectric layer is less than 500 nm.

5. The array substrate as claimed in claim 1, wherein the first metal layer and the second metal layer are both located at the display region, and wherein a projection region of the through hole on the substrate does not overlap with a projection region of the first metal layer and the second metal layer on the substrate.

6. A method of manufacturing an array substrate, comprising:
   providing a substrate comprising a display region;
   forming a low temperature polysilicon layer on the substrate and located at the display region;
   forming an inorganic film group layer on the substrate on which the low temperature polysilicon layer is formed;
   forming a through hole on the inorganic film group layer, wherein the through hole is located above the low temperature polysilicon layer, and an angle between a sidewall and a bottom wall of the through hole ranges from 105 to 110 degrees;
   forming an organic layer on the inorganic film group layer, wherein the organic layer does not fill the through hole, and a thickness of the organic layer is less than 1500 nm; and
   forming a source/drain layer on the organic layer, the source/drain layer covering the sidewall and the bottom wall of the through hole to be connected to the low temperature polysilicon layer;
   wherein the inorganic film group layer comprises a first gate insulating layer, a second gate insulating layer, and an interlayer dielectric layer, which are sequentially away from the low temperature polysilicon layer; the step of forming the inorganic film group layer on the substrate on which the low temperature polysilicon layer is formed comprises:
   depositing the first gate insulating layer on the substrate on which the low temperature polysilicon layer is formed, the first gate insulating layer covering the low temperature polysilicon layer;
   depositing the second gate insulating layer on the first gate insulating layer; and
   depositing the interlayer dielectric layer on the second gate insulating layer; wherein a total thickness of the first gate insulating layer, the second gate insulating layer, and the interlayer dielectric layer is less than 740 nm.

7. A display panel, comprising an array substrate, the array substrate comprising:
   a substrate comprising a display region;
   a low temperature polysilicon layer disposed on the substrate and located at the display region;
   an inorganic film group layer disposed on the substrate and covering the low temperature polysilicon layer, wherein the inorganic film group layer is provided with a through hole, the through hole is located above the low temperature polysilicon layer, and an angle between a sidewall and a bottom wall of the through hole ranges from 105 to 110 degrees, wherein the inorganic film group layer comprises a first gate insulating layer, a second gate insulating layer, and an interlayer dielectric layer, which are sequentially away from the low temperature polysilicon layer; a total thickness of the first gate insulating layer, the second gate insulating layer, and the interlayer dielectric layer is less than 740 nm;
   a first metal layer disposed between the first gate insulating layer and the second gate insulating layer;
   a second metal layer disposed between the second gate insulating layer and the interlayer dielectric layer;
   an organic layer disposed on the inorganic film group layer and does not fill the through hole, the source/drain layer is located on the organic layer, and a thickness of the organic layer is less than 1500 nm; and
   a source/drain layer disposed on the organic layer, the source/drain layer covering the sidewall and the bottom wall of the through hole to be connected to the low temperature polysilicon layer.

8. The display panel as claimed in claim 7, wherein a thickness of the first gate insulating layer is less than 130 nm.

9. The display panel as claimed in claim 7, wherein a thickness of the second gate insulating layer is less than 110 nm.

10. The display panel as claimed in claim 7, wherein a thickness of the interlayer dielectric layer is less than 500 nm.

11. The display panel as claimed in claim 7, wherein the first metal layer and the second metal layer are both located at the display region, and wherein a projection region of the through hole on the substrate does not overlap with a projection region of the first metal layer and the second metal layer on the substrate.

* * * * *